United States Patent
Zejda et al.

(10) Patent No.: US 8,091,049 B2
(45) Date of Patent: Jan. 3, 2012

(54) INTEGRATED SINGLE SPICE DECK SENSITIZATION FOR GATE LEVEL TOOLS

(75) Inventors: Jindrich Zejda, Sunnyvale, CA (US);
Narender Hanchate, Sunnyvale, CA (US); Rupesh Nayak, San Ramon, CA (US); Li Ding, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 765 days.

(21) Appl. No.: 12/166,630

(22) Filed: Jul. 2, 2008

(65) Prior Publication Data

US 2010/0005429 A1    Jan. 7, 2010

(51) Int. Cl.
*G06F 17/50*    (2006.01)

(52) U.S. Cl. ........ 716/100; 716/106; 716/107; 716/108; 716/134; 716/136

(58) Field of Classification Search .......... 716/100–108, 716/111–115, 134, 136
See application file for complete search history.

(56) References Cited

U.S. PATENT DOCUMENTS

| | | | |
|---|---|---|---|
| 2003/0115035 A1* | 6/2003 | Kulshreshtha et al. | 703/19 |
| 2006/0200786 A1* | 9/2006 | Chang | 716/6 |

* cited by examiner

*Primary Examiner* — Paul Dinh
(74) *Attorney, Agent, or Firm* — Park, Vaughan, Fleming & Dowler LLP; Laxman Sahasrabuddhe (57) ABSTRACT

One embodiment of the present invention provides systems and techniques for generating a transistor-level description of a subcircuit. A user may want to simulate a subcircuit in a circuit using a transistor-level simulator, and one or more cells in the subcircuit may need to be sensitized so that the cells are in a desired state when the subcircuit is simulated. An embodiment modifies the subcircuit by inserting analog switches in front of the cells that need to be sensitized, so that the analog switches can be used to apply a sensitization sequence to the cells during the transistor-level simulation. The embodiment can then generate a transistor-level description of the modified subcircuit. Next, the transistor-level description of the subcircuit can be stored, thereby enabling the transistor-level simulator to simulate the subcircuit.

20 Claims, 5 Drawing Sheets

FIG. 7

INTEGRATED SINGLE SPICE DECK SENSITIZATION FOR GATE LEVEL TOOLS

BACKGROUND

1 Field of the Invention

The present invention generally relates to electronic design automation. More specifically, the present invention relates to methods and apparatuses for generating a transistor-level description of a portion of a circuit.

2 Related Art

Rapid advances in computing technologies have been made possible by advances in design and verification tools, because, without such tools, it would have been almost impossible to design and verify complicated integrated circuits which are commonly found in today's computing devices.

Unlike simulation-based techniques, STA (static timing analysis) verifies timing by computing the worst-case delays without enumerating all possible paths. Since STA does not enumerate all possible paths, STA can perform a thorough timing analysis for large integrated circuits within a reasonable amount of time.

Although an STA tool can quickly analyze a large number of paths, the delay values generated by the STA tool are usually not as accurate as those generated by a transistor-level simulator. Hence, it is generally desirable to improve the accuracy of STA tools by enabling them to leverage transistor-level simulation.

SUMMARY

One embodiment of the present invention provides a system that generates a transistor-level description of a portion of a circuit. A subcircuit, i.e., a portion of a circuit, may need to be simulated using a transistor-level simulator, and one or more cells in the subcircuit may need to be sensitized so that the cells are in a desired state when the subcircuit is simulated.

The system can modify the subcircuit by inserting analog switches before the cells that need to be sensitized, so that the analog switches can be used to apply a sensitization sequence to the cells during the transistor-level simulation. The system can then generate a transistor-level description of the modified sub circuit.

A transistor-level simulator can then use the transistor-level description of the modified subcircuit to simulate the path. Specifically, during the transistor-level simulation, an analog switch is used to apply a sensitization sequence to an input of a cell. Once the cell is properly sensitized, the analog switch is used to couple the cell's input with whatever the cell's input was coupled with in the unmodified subcircuit. Once the cell has been properly sensitized, the transistor-level simulator can continue with the simulation and measure any property, e.g., delay, that is desired to be measured.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Integrated Circuit (IC) Design Flow

Figure 1:
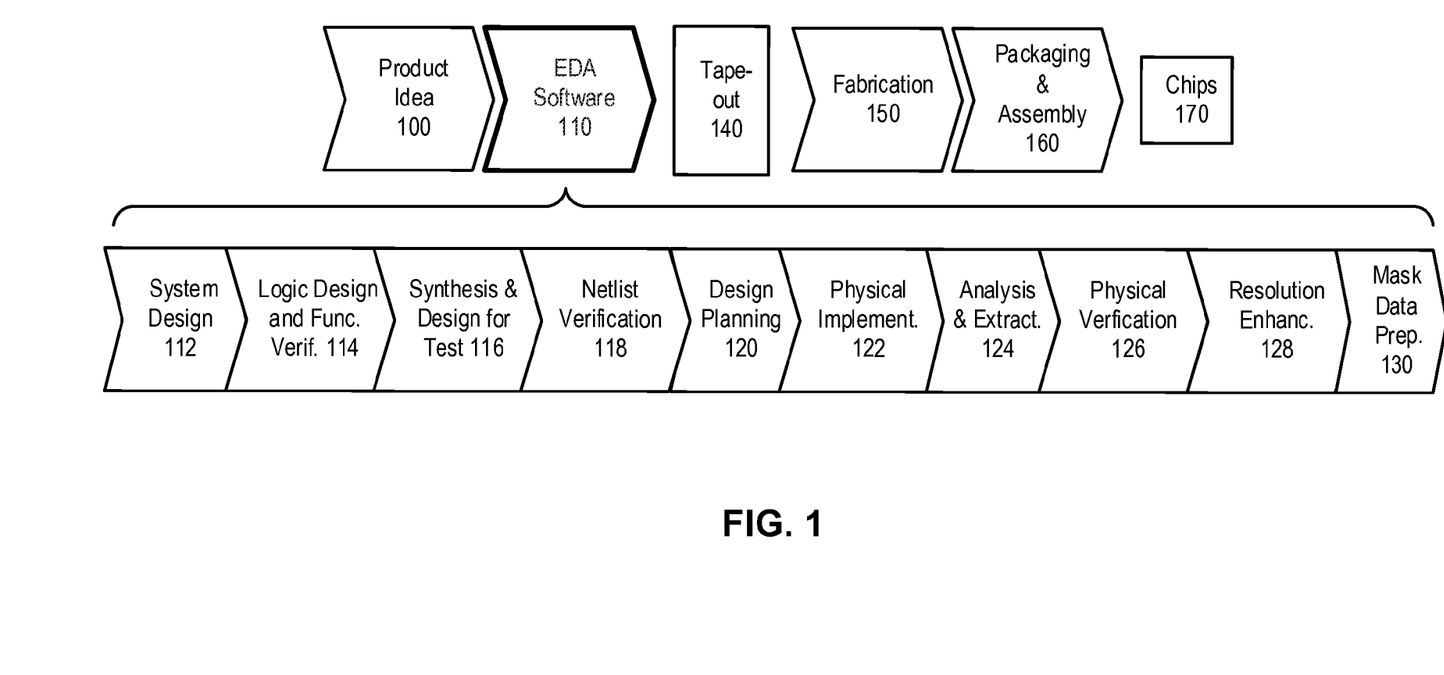
FIG. 1 illustrates various stages in the design and fabrication of an integrated circuit in accordance with an embodiment of the present invention.

FIG. 1 illustrates various stages in the design and fabrication of an integrated circuit in accordance with an embodiment of the present invention.

The process usually starts with a product idea (step 100) which is realized using an EDA process (step 110). Once the design is finalized, it is usually taped-out (event 140) and goes through the fabrication process (step 150) and packaging and assembly processes (step 160) to produce the finished chips (result 170).

The EDA process (step 110) comprises steps 112-130, which are described below for illustrative purposes only and are not meant to limit the present invention. For example, an actual integrated circuit design may require the designer to perform the design steps in a different sequence than the sequence described below.

System design (step 112): In this step, the designers describe the functionality that they want to implement. They can also perform what-if planning to refine functionality, check costs, etc. Hardware-software architecture partitioning can occur at this stage. Exemplary EDA software products from Synopsys, Inc. that can be used at this step include Model Architect, Saber®, System Studio, and DesignWare® products.

Logic design and functional verification (step 114): At this stage, the VHDL or Verilog code for modules in the system is written and the design is checked for functional accuracy. More specifically, the design is checked to ensure that it produces the correct outputs. Exemplary EDA software products from Synopsys, Inc. that can be used at this step include VCS®, Vera®R, DesignWare®, Magellan™, Formality®, ESP and Leda® products.

Synthesis and design for test (step 116): The VHDL/Verilog can be translated to a netlist in this stage. The netlist can be optimized for the target technology, and tests can be designed and implemented to check the finished chips. Exemplary EDA software products from Synopsys, Inc. that can be used at this step include Design Compiler®, Physical Compiler®, Test Compiler, Power Compiler™, FPGA Compiler, TetraMAX®, and DesignWare® products.

Netlist verification (step 118): In this step, the netlist is checked for compliance with timing constraints and for correspondence with the VHDL/Verilog source code. Exemplary EDA software products from Synopsys, Inc. that can be used at this step include Formality®, PrimeTime®, and VCS® products.

Design planning (step 120): Here, an overall floorplan for the chip is constructed and analyzed for timing and top-level routing. Exemplary EDA software products from Synopsys, Inc. that can be used at this step include Astro™ and IC Compiler products.

Physical implementation (step 122): The placement (positioning of circuit elements) and routing (connection of the same) occur at this step. Exemplary EDA software products from Synopsys, Inc. that can be used at this step include the Astro™ and IC Compiler products.

Analysis and extraction (step 124): At this stage, the circuit function is verified at a transistor level; this, in turn, permits what-if refinement. Exemplary EDA software products from Synopsys, Inc. that can be used at this step include Astro-Rail™, PrimeRail, PrimeTime®, and Star-RCXT™ products.

Physical verification (step 126): In this step, the design is checked to ensure correctness for manufacturing, electrical issues, lithographic issues, and circuitry. Exemplary EDA software products from Synopsys, Inc. that can be used at this step include the Hercules™ product.

Resolution enhancement (step 128): This step involves geometric manipulations of the layout to improve manufacturability of the design. Exemplary EDA software products from Synopsys, Inc. that can be used at this step include Proteus/Progen, ProteusAF, and PSMGen products.

Mask data preparation (step 130): This step provides the "tape-out" data for production of masks to produce finished chips. Exemplary EDA software products from Synopsys, Inc. that can be used at this step include the CATS® family of products.

Embodiments of the present invention can be used during one or more of the above-described steps. Specifically, one embodiment of the present invention can be used during netlist verification (step 118).

Cell Sensitization

Figure 2:
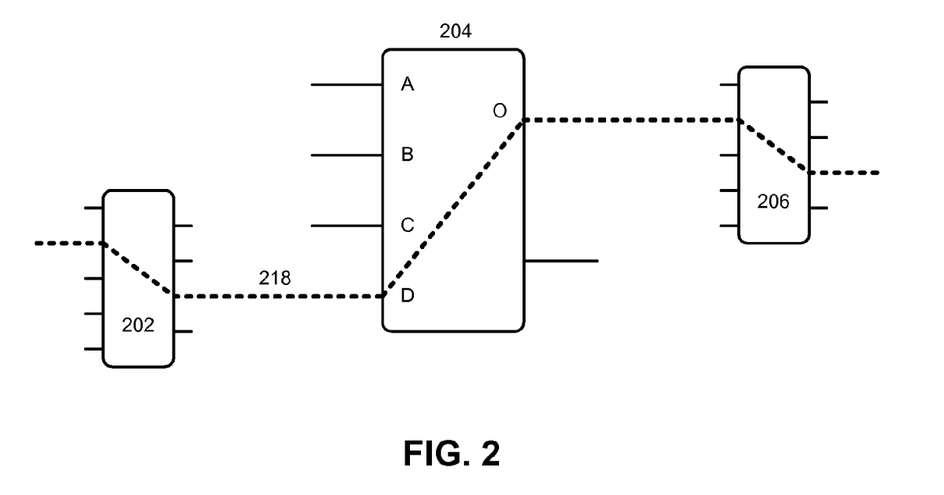
FIG. 2 illustrates a circuit segment (such as 3 cells of a delay-critical path) that is to be analyzed using a transistor-level simulator in accordance with an embodiment of the present invention.

FIG. 2 illustrates a circuit segment (such as 3 cells of a delay-critical path) that is to be analyzed using a transistor-level simulator in accordance with an embodiment of the present invention.

Cells 202, 204, and 206 are part of a circuit. An STA tool may be used to identify critical paths in the circuit. For example, the STA tool may identify critical path 218 (shown as a dotted line) which passes through cells 202, 204, and 206. Note that the term "critical path" can generally refer to any portion of the circuit that is desired to be simulated at the transistor level. For example, a critical path can be a timing path, a noise propagation path, a yield-sensitive subcircuit, a double-clocked subcircuit, or any other subcircuit of interest.

Since the delay values calculated by the STA tool may not be sufficiently accurate, it may be desirable to simulate the critical path at the transistor level. A cell's behavior can depend on the specific state of the cell. In particular, the delay between an input and an output of a cell can depend on the cell's state. Hence, it is important to ensure that the cell is in the proper state before the transistor-level simulation is performed to measure electrical properties such as delay.

Cell sensitization is the process of bringing a cell to a particular state. For example, a sequence of input signals can be applied to a cell which can cause the cell to reach a desired state. Once the cell is in the desired state, a detailed transistor-level simulation can be performed to determine the delay values.

Figure 3:
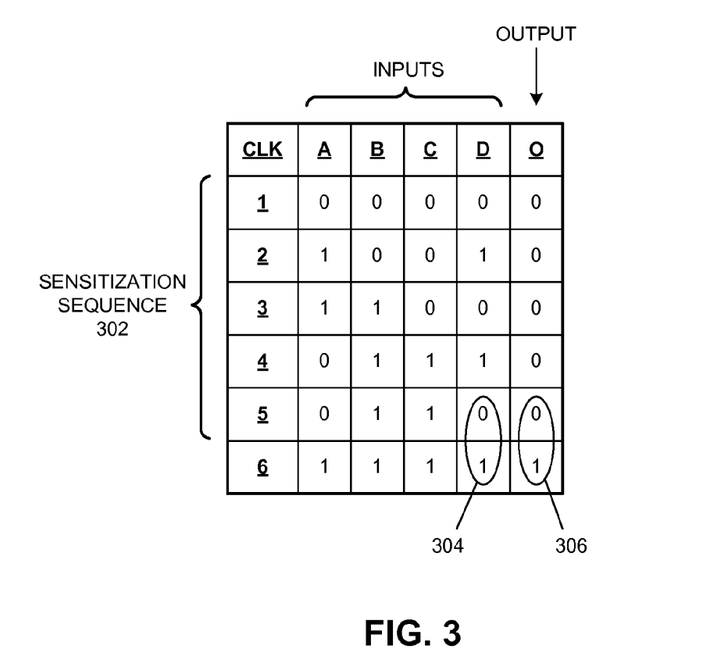
FIG. 3 illustrates a sensitization sequence which can be used to sensitize a cell in accordance with an embodiment of the present invention.

FIG. 3 illustrates a sensitization sequence which can be used to sensitize a cell in accordance with an embodiment of the present invention.

Different states of a cell are usually associated with different sensitization sequences. A sensitization sequence can specify the values that need to be applied to the inputs of a cell in each sensitization clock cycle to cause the cell to reach the desired state at the end of the sensitization sequence.

For example, sensitization sequence 302 is designed to cause cell 204 to reach a desired state. Cell 204 includes inputs "A," "B," "C," and "D," and it includes output "O." Sensitization sequence 302 specifies the input values at each sensitization clock cycle (which can be different from the system clock cycle) that need to be applied to cell 204's inputs so that the cell reaches the desired state. For example, sensitization sequence 302 specifies that, in sensitization clock cycle "1," inputs "A," "B," "C," and "D," should be equal to "0," "0," "0," and "0," respectively, and that, in sensitization clock cycle "2," inputs "A," "B" "C ," and "D," should be equal to "1," "0," "0," and "1, " respectively, and so on.

FIG. 3 also shows the expected values at output "O" for each sensitization clock cycle. However, the output value is not used for sensitizing the cell. Further, note that sensitization clock cycle "6" is also not part of the sensitization sequence. Cell 204 reaches the desired state after five sensitization clock cycles. Sensitization clock cycle "6" represents the input values that need to be applied to cell 204 for the transition event that is desired to be simulated. Specifically, between sensitization clock cycle "5" and sensitization clock cycle "6," input "D" changes its value from "0" to "1." This causes output "O" to change its value from "0" to "1." These two transitions are illustrated in FIG. 3: transition 304 represents the change in value of "D," and transition 306 represents the change in value of "O."

As mentioned before, in order to accurately determine the delay between transitions 304 and 306, cell 204 must first be sensitized so that it is in the desired state. Otherwise, the delay measurement will not be accurate or it may even not be possible.

Note that simulating the whole circuit with sensitization sequence for all cells at the transistor level is impractical because the simulation can take too long to run. Hence, the circuit first needs to be sensitized to exactly the state at which the user wants the transistor-level simulation to begin so that the transistor-level simulation does not waste time simulating events that the user does not care about. Unfortunately, the problem of determining the sequence of inputs that need to be applied to a circuit so that multiple cells in the circuit are simultaneously sensitized is NP-hard.

Conventional techniques for sensitizing a cell suffer from serious drawbacks. One conventional approach saves the state of a cell by storing the voltages at various nodes within the cell. In other words, a conventional technique would sensitize cell 204 to bring it to a desired state, and then, the technique would store various voltage values within the cell. Subsequently, when the cell needs to be brought to a desired state, these saved voltages can be used to directly bring the cell to the desired state. Unfortunately, this technique suffers from at least two serious drawbacks. First, this technique usually requires human intervention because a user may need to determine which nodes within the cell need to be saved. Second, a large amount of storage is usually required to store the internal state of a cell. A complex cell can easily have thousands of nodes within it, and hence, storing a cell state can require storing thousands of voltage values. Furthermore, conventional techniques usually have to explicitly handle voltage (VDD) variations by storing even more data, and they cannot support unbuffered inputs and outputs.

In contrast to conventional techniques, an embodiment of the present invention provides systems and techniques for concurrently sensitizing multiple cells without suffering from any of the above-mentioned drawbacks. Specifically, an embodiment uses analog switches to switch between the sensitization sequence and the signal along the path under investigation during the transistor-level simulation. Since this embodiment does not store the internal state of a cell, it does not require large amounts of storage. Furthermore, since this embodiment does not perform a full blown transistor-level simulation of the whole circuit, it does not require an unreasonably long time to execute.

Cell Sensitization by Using an Analog Switch

Figure 4:
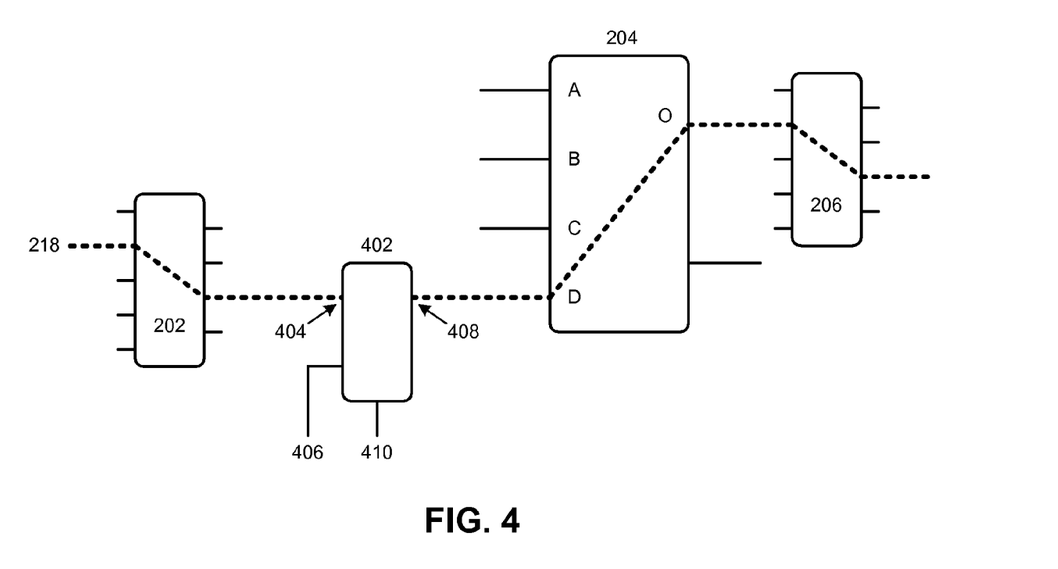
FIG. 4 illustrates how analog switches can be used to sensitize cells in accordance with an embodiment of the present invention.

FIG. 4 illustrates how analog switches can be used to sensitize cells in accordance with an embodiment of the present invention. Note that FIG. 4 is not intended to limit the scope of the invention. Specifically, although FIG. 4 illustrates an embodiment of the present invention in the context of a path, embodiments of the present invention are generally applicable to any subcircuit. The term "subcircuit" generally refers to any portion of a circuit. Specifically, the term "subcircuit" is not intended to be limited to a transistor-level netlist of an individual cell.

In FIG. 4, analog switch 402 has been inserted in path 218 between cells 202 and 204. Analog switch 402 includes inputs 404 and 406, and output 408. Input 404 is coupled with an output of cell 202, and output 408 is coupled with input "D" of cell 204. Analog switch 402 also includes control input 410 which can be used to control whether input 404 is coupled with output 408 or whether input 406 is coupled with output 408.

During the transistor-level simulation, the sensitization sequence is applied to input 406, and the control input 410 is used to couple input 406 with output 408. In this manner, cell 204 can be sensitized independently of the rest of the circuit. Note that when input 406 is coupled with output 408, path 218 is broken. However, once cell 204 has been properly sensitized, control input 410 is used to couple input 404 with output 408, thereby reestablishing path 218. Once cell 204 has been sensitized, the transistor-level simulator can proceed with the simulation as usual and measure the desired delay value.

Although, for the sake of clarity, FIG. 4 illustrates only one analog switch, it will be evident to one skilled in the art that multiple analog switches can be used in the circuit to concurrently sensitize multiple cells in the circuit.

Specifically, the system can sensitize each cell just before a particular signal value reaches the cell. For example, suppose the transition that we want to simulate occurs in sensitization clock cycle t. Further, suppose that it requires s sensitization clock cycles to sensitize a cell. One embodiment can begin sensitization of the cell at sensitization clock cycle (t-s-1) so that the cell is sensitized just before the transition that we are interested in occurs in sensitization clock cycle t. Alternatively, the system can concurrently sensitize multiple cells in the circuit so that they are sensitized at the same time.

The analog switch enables each cell to be sensitized independently of other signals in the circuit. Specifically, the subcircuit can be decoupled from the rest of the circuit, and the transistor-level simulation only has to be performed on the subcircuit. For this reason, the transistor-level simulation does not require an unreasonably long time to execute. In the absence of the analog switch based approach, the system would have to simulate the whole circuit at the transistor level to ensure that each cell was properly sensitized. And, as mentioned before, performing a full blown transistor-level simulation of the whole circuit is impractical because it can take an unreasonably long time to execute. Furthermore, as mentioned before, even determining the input values for such a full blown transistor-level simulation is an NP-hard problem.

An embodiment of the present invention is based on the following insight: if we modify the circuit so that it enables the transistor-level simulator to independently sensitize the cells during simulation, we can solve the sensitization problem without the drawbacks that are present in the conventional approaches.

Note that this insight is very counter-intuitive. Conventional techniques do not modify the circuit when they generate the transistor-level description because the whole idea behind generating the transistor-level description is to ensure that the results obtained from the simulation are accurate. Since accuracy is of paramount importance, it is very counter-intuitive to modify the circuit.

Specifically, an embodiment of the present invention is based on the following insight: if we insert analog switches in front of the cells, the analog switches can enable the transistor-level simulator to independently sensitize the cells, but at the same time, the effect of the analog switches on the operation of the circuit will be negligible.

It will be evident to one skilled in the art that an analog switch can be implemented in a number of ways. In general, the properties of the analog switch can be specified as follows. First, the analog switch has an input which is used to apply the sensitization sequence to the cell. Second, the analog switch has another input which is used to reestablish the path once the sensitization is complete. Third, the analog switch has a control input which is used to switch between the inputs. Finally, the analog switch switches between the inputs in a smooth or continuous fashion.

Figure 5:
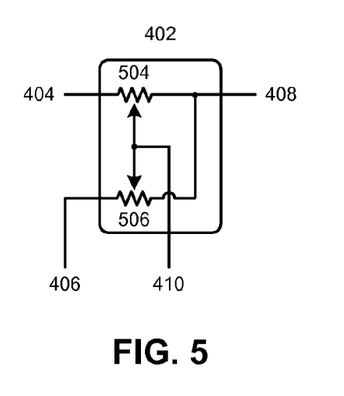
FIG. 5 illustrates an analog switch in accordance with an embodiment of the present invention.

FIG. 5 illustrates an analog switch in accordance with an embodiment of the present invention.

Analog switch 402 shown in FIG. 5 includes inputs 404 and 406, output 408, and control input 410. Inputs 404 and 406 are coupled with one end of voltage controlled resistances 504 and 506, respectively. The other ends of these voltage controlled resistances are coupled to output 408. The resistances are controlled by control input 410.

When control input 410 is low, voltage controlled resistance 504 has a low impedance, e.g., the impedance is substantially equal to 0; however, when control input 410 is high, voltage controlled resistance 504 has an extremely high impedance, e.g., the resistance is substantially an open circuit. Conversely, when control input 410 is low, voltage controlled resistance 506 has an extremely high impedance, but when the control input 410 is high, voltage controlled resistance 506 has a low impedance. In this manner, the switching between inputs 404 and 406 can be performed smoothly because the impedance of the voltage controlled resistors varies smoothly between an extremely low value and an extremely high value.

Note that the analog switch shown in FIG. 5 is only for illustration purposes, and is not intended to limit the scope of the invention. Accordingly, many modifications and variations will be apparent to practitioners skilled in the art.

A Process for Generating a Transistor-Level Description

Figure 6:
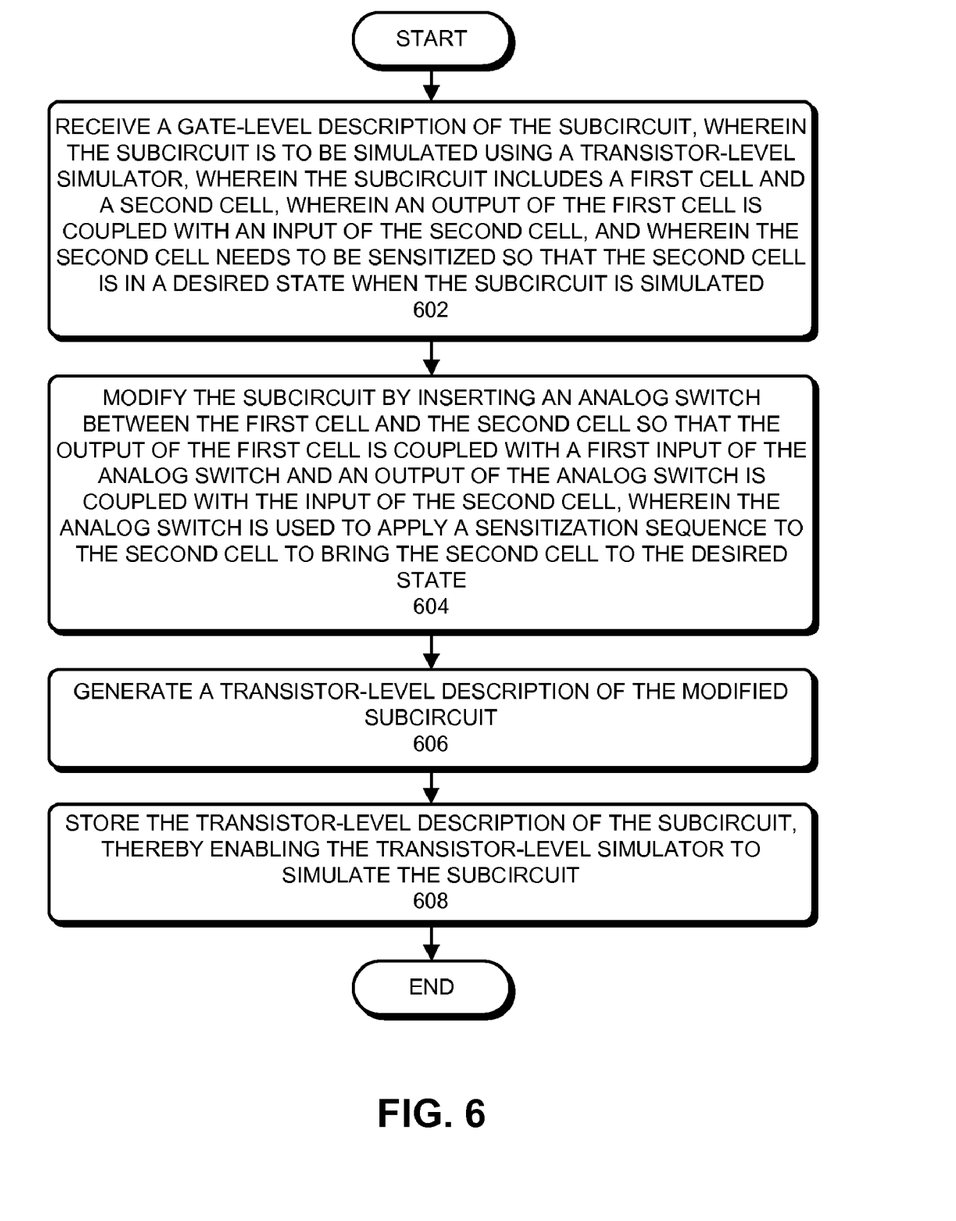
FIG. 6 presents a flowchart that illustrates a process for generating a transistor-level description of a subcircuit in accordance with an embodiment of the present invention.

FIG. 6 presents a flowchart that illustrates a process for generating a transistor-level description of a subcircuit in accordance with an embodiment of the present invention.

The process can begin by receiving a gate-level description of the subcircuit, wherein the subcircuit is to be simulated using a transistor-level simulator, wherein the subcircuit includes a first cell and a second cell, wherein an output of the first cell is coupled with an input of the second cell, and wherein the second cell needs to be sensitized so that the second cell is in a desired state when the subcircuit is simulated (step 602).

Next, the system can modify the subcircuit by inserting an analog switch between the first cell and the second cell so that the output of the first cell is coupled with a first input of the analog switch and an output of the analog switch is coupled with the input of the second cell, wherein the analog switch is used to apply a sensitization sequence to the second cell to bring the second cell to the desired state (step 604).

In addition to the first input, the analog switch can include a second input and a control input which controls whether the first input is coupled with the output of the analog switch, or whether the second input is coupled with the output of the analog switch. The analog switch switches smoothly between a first state and a second state, wherein in the first state, the first input is coupled with the output of the analog switch, and wherein in the second state, the second input is coupled with the output of the analog switch. In one embodiment, the analog switch can include a voltage controlled resistor which is controlled by the control input's voltage.

The system can then generate a transistor-level description of the modified subcircuit (step 606). In one embodiment, the transistor-level description of the subcircuit is in a format that is compatible with SPICE (Simulation Program with Integrated Circuit Emphasis), or a variant thereof.

Next, the system can store the transistor-level description of the subcircuit, thereby enabling the transistor-level simulator to simulate the subcircuit (step 608).

During simulation, the transistor-level simulator can use the control input to couple the second input with the output of the analog switch to sensitize the second cell, and once the second cell has reached the desired state, the transistor-level simulator can use the control input to couple the first input with the output of the analog switch so that the output of the first cell is coupled with the input of the second cell.

In one embodiment, the second cell may need to be in the desired state before a particular signal reaches the input of the second cell. If so, the transistor-level simulator can begin sensitization of the second cell so that the second cell reaches the desired state just before the particular signal reaches the input of the second cell.

Figure 7:
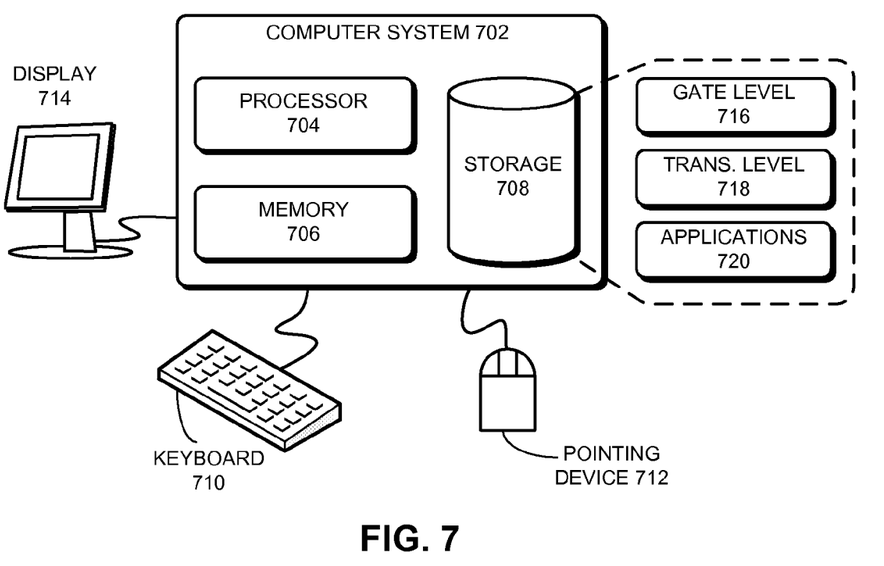
FIG. 7 illustrates a computer system in accordance with an embodiment of the present invention.

FIG. 7 illustrates a computer system in accordance with an embodiment of the present invention.

Computer system 702 comprises processor 704 (which can include one or more cores), memory 706, and storage device 708. Computer system 702 can be coupled to display 714, keyboard 710, and pointing device 712. Storage device 708 can store a gate-level description 716 of the circuit, a transistor-level description 718 of the subcircuit, and applications 720. Applications 720 can include a static timing analysis tool and a transistor-level simulator. In one embodiment, computer system 702 can include a multiprocessor system.

During operation, computer system 702 can load a static timing analysis tool into memory 706. Next, a user can use the static timing analysis tool to analyze a circuit whose gate-level description 716 is stored on storage device 708. Note that an embodiment of the present invention can be integrated with a static timing analysis tool or it can be a standalone application. In either case, the user can use an embodiment of the present invention to generate a transistor-level description 718 of the subcircuit which can then be stored on storage device 708. The user can then use the transistor-level description 718 to simulate the subcircuit at the transistor level.

Conclusion

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for generating a transistor-level description of a subcircuit, the method comprising:
   receiving a gate-level description of the subcircuit, wherein the subcircuit is to be simulated using a transistor-level simulator, wherein the subcircuit includes a first cell and a second cell, wherein an output of the first cell is coupled with an input of the second cell, and wherein the second cell needs to be sensitized so that the second cell is in a desired state when the subcircuit is simulated;
   modifying, by computer, the subcircuit by inserting an analog switch between the first cell and the second cell so that the output of the first cell is coupled with a first input of the analog switch and an output of the analog switch is coupled with the input of the second cell, wherein the analog switch is used to apply a sensitization sequence to the second cell to bring the second cell to the desired state;
   generating a transistor-level description of the modified subcircuit; and
   storing the transistor-level description of the subcircuit, thereby enabling the transistor-level simulator to simulate the subcircuit.

2. The method of claim 1,
   wherein the analog switch includes a second input and a control input, wherein the control input controls whether the first input of the analog switch is coupled with the output of the analog switch or whether the second input of the analog switch is coupled with the output of the analog switch; and wherein when the transistor-level simulator simulates the subcircuit, the transistor-level simulator uses the control input to couple the second input of the analog switch with the output of the analog switch to sensitize the second cell, and once the second cell has reached the desired state, the transistor-level simulator uses the control input to couple the first input of the analog switch with the output of the analog switch so that the output of the first cell is coupled with the input of the second cell.

3. The method of claim 2, wherein the second cell needs to be in the desired state before a particular signal reaches the input of the second cell, and wherein the transistor-level simulator begins sensitization of the second cell so that the second cell reaches the desired state just before the particular signal reaches the input of the second cell.

4. The method of claim 2, wherein the analog switch switches smoothly between a first state and a second state, wherein in the first state, the first input of the analog switch is coupled with the output of the analog switch, and wherein in the second state, the second input of the analog switch is coupled with the output of the analog switch.

5. The method of claim 4, wherein the analog switch includes a voltage controlled resistor which is controlled by the control input's voltage.

6. The method of claim 1, wherein the transistor-level description of the subcircuit is in a format that is compatible with SPICE (Simulation Program with Integrated Circuit Emphasis), or a variant thereof.

7. The method of claim 1, wherein the method is performed by a static timing analysis tool.

8. A non-transitory computer-readable storage medium storing instructions that when executed by a computer cause the computer to perform a method for generating a transistor-level description of a subcircuit, the method comprising:
receiving a gate-level description of the subcircuit, wherein the subcircuit is to be simulated using a transistor-level simulator, wherein the subcircuit includes a first cell and a second cell, wherein an output of the first cell is coupled with an input of the second cell, and wherein the second cell needs to be sensitized so that the second cell is in a desired state when the subcircuit is simulated;
modifying the subcircuit by inserting an analog switch between the first cell and the second cell so that the output of the first cell is coupled with a first input of the analog switch and an output of the analog switch is coupled with the input of the second cell, wherein the analog switch is used to apply a sensitization sequence to the second cell to bring the second cell to the desired state;
generating a transistor-level description of the modified subcircuit; and
storing the transistor-level description of the subcircuit, thereby enabling the transistor-level simulator to simulate the subcircuit.

9. The non-transitory computer-readable storage medium of claim 8,
wherein the analog switch includes a second input and a control input, wherein the control input controls whether the first input of the analog switch is coupled with the output of the analog switch or whether the second input of the analog switch is coupled with the output of the analog switch; and
wherein when the transistor-level simulator simulates the subcircuit, the transistor-level simulator uses the control input to couple the second input of the analog switch with the output of the analog switch to sensitize the second cell, and once the second cell has reached the desired state, the transistor-level simulator uses the control input to couple the first input of the analog switch with the output of the analog switch so that the output of the first cell is coupled with the input of the second cell.

10. The non-transitory computer-readable storage medium of claim 9, wherein the second cell needs to be in the desired state before a particular signal reaches the input of the second cell, and wherein the transistor-level simulator begins sensitization of the second cell so that the second cell reaches the desired state just before the particular signal reaches the input of the second cell.

11. The non-transitory computer-readable storage medium of claim 9, wherein the analog switch switches smoothly between a first state and a second state, wherein in the first state, the first input of the analog switch is coupled with the output of the analog switch, and wherein in the second state, the second input of the analog switch is coupled with the output of the analog switch.

12. The non-transitory computer-readable storage medium of claim 11, wherein the analog switch includes a voltage controlled resistor which is controlled by the control input's voltage.

13. The non-transitory computer-readable storage medium of claim 8, wherein the transistor-level description of the subcircuit is in a format that is compatible with SPICE (Simulation Program with Integrated Circuit Emphasis), or a variant thereof.

14. The non-transitory computer-readable storage medium of claim 8, wherein the method is performed by a static timing analysis tool.

15. An apparatus, comprising:
a processor; and
a computer-readable storage medium storing instructions that when executed by the processor cause the apparatus to perform a method for generating a transistor-level description of a subcircuit, the method comprising:
receiving a gate-level description of the subcircuit, wherein the subcircuit is to be simulated using a transistor-level simulator, wherein the subcircuit includes a first cell and a second cell, wherein an output of the first cell is coupled with an input of the second cell, and wherein the second cell needs to be sensitized so that the second cell is in a desired state when the subcircuit is simulated;
modifying the subcircuit by inserting an analog switch between the first cell and the second cell so that the output of the first cell is coupled with a first input of the analog switch and an output of the analog switch is coupled with the input of the second cell, wherein the analog switch is used to apply a sensitization sequence to the second cell to bring the second cell to the desired state;
generating a transistor-level description of the modified subcircuit; and
storing the transistor-level description of the subcircuit, thereby enabling the transistor-level simulator to simulate the subcircuit.

16. The apparatus of claim 15,
wherein the analog switch includes a second input and a control input, wherein the control input controls whether the first input of the analog switch is coupled with the output of the analog switch or whether the second input of the analog switch is coupled with the output of the analog switch; and wherein when the transistor-level simulator simulates the subcircuit, the transistor-level simulator uses the control input to couple the second input of the analog switch with the output of the analog switch to sensitize the second cell, and once the second cell has reached the desired state, the transistor-level simulator uses the control input to couple the first input of the analog switch with the output of the analog switch so that the output of the first cell is coupled with the input of the second cell.

17. The apparatus of claim 16, wherein the second cell needs to be in the desired state before a particular signal reaches the input of the second cell, and wherein the transistor-level simulator begins sensitization of the second cell so that the second cell reaches the desired state just before the particular signal reaches the input of the second cell.

18. The apparatus of claim 16, wherein the analog switch switches smoothly between a first state and a second state, wherein in the first state, the first input of the analog switch is coupled with the output of the analog switch, and wherein in the second state, the second input of the analog switch is coupled with the output of the analog switch.

19. The apparatus of claim 18, wherein the analog switch includes a voltage controlled resistor which is controlled by the control input's voltage.

20. The apparatus of claim 15, wherein the transistor-level description of the subcircuit is in a format that is compatible with SPICE (Simulation Program with Integrated Circuit Emphasis), or a variant thereof.

* * * * *